(12) United States Patent
Tu

(10) Patent No.: US 9,229,084 B2
(45) Date of Patent: Jan. 5, 2016

(54) MAGNETOMETER CALIBRATION

(71) Applicant: Apple Inc., Cupertino, CA (US)

(72) Inventor: Xiaoyuan Tu, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/269,677

(22) Filed: May 5, 2014

(65) Prior Publication Data

US 2014/0244200 A1 Aug. 28, 2014

Related U.S. Application Data

(62) Division of application No. 12/899,392, filed on Oct. 6, 2010, now Pat. No. 8,717,009.

(51) Int. Cl.
*G01R 35/00* (2006.01)
*G01C 21/00* (2006.01)
*G01R 33/00* (2006.01)
*G01R 33/028* (2006.01)

(52) U.S. Cl.
CPC ............ *G01R 35/00* (2013.01); *G01R 33/0035* (2013.01); *G01R 33/028* (2013.01)

(58) Field of Classification Search
CPC .................................................. G01N 27/9086
USPC .......................................... 324/202; 701/480
See application file for complete search history.

(56) References Cited

U.S. PATENT DOCUMENTS 5,075,693 A 12/1991 McMillan et al.
5,165,269 A 11/1992 Nguyen (Continued)

FOREIGN PATENT DOCUMENTS

EP 1 221 586 7/2002
JP 2005-134343 5/2005

(Continued)

OTHER PUBLICATIONS

"Honeywell 3-Axis Digital Compass IC, HMC5843 Electronic Compass," Honeywell International Inc. [online]; retrieved from the Internet: <URL: http://www.honeywell.com/sites/portal?smap=aerospace&page=Magnetic-Sensors3&theme=T15&catID=CF84B17AB-A9OF-716D-10BC-A1E75441138E&id=HF916B4E0-4F71-9DB5-DFA8-51B1944918EE&sel=2&sel4=1>, retrieved on Jun. 5, 2005, 1 page.

(Continued)

*Primary Examiner* — Bot Ledynh
(74) *Attorney, Agent, or Firm* — Fish & Richardson P.C.

(57) ABSTRACT

A real-time calibration system and method for a mobile device having an onboard magnetometer uses an estimator to estimate magnetometer calibration parameters and a magnetic field external to the mobile device (e.g., the earth magnetic field). The calibration parameters can be used to calibrate uncalibrated magnetometer readings output from the onboard magnetometer. The external magnetic field can be modeled as a weighted combination of a past estimate of the external magnetic field and the asymptotic mean of that magnetic field, perturbed by a random noise (e.g., Gaussian random noise). The weight can be adjusted based on a measure of the statistical uncertainty of the estimated calibration parameters and the estimated external magnetic field. The asymptotic mean of the external magnetic field can be modeled as a time average of the estimated external magnetic field.

8 Claims, 6 Drawing Sheets

(56) References Cited

U.S. PATENT DOCUMENTS

| | | | |
|---|---|---|---|
| 5,349,529 A | 9/1994 | Masumoto et al. | |
| 5,761,094 A | 6/1998 | Olson et al. | |
| 5,946,813 A | 9/1999 | Nachbaur et al. | |
| 6,204,804 B1 | 3/2001 | Andersson | |
| 6,311,098 B1 | 10/2001 | Higasayama et al. | |
| 6,311,129 B1 | 10/2001 | Lin | |
| 6,384,384 B1 | 5/2002 | Connolly et al. | |
| 6,408,245 B1 | 6/2002 | An et al. | |
| 6,424,914 B1 | 7/2002 | Lin | |
| 6,508,316 B2 | 1/2003 | Estes et al. | |
| 6,539,639 B2 | 4/2003 | Smith | |
| 6,622,091 B2 | 9/2003 | Perlmutter et al. | |
| 6,651,003 B2 | 11/2003 | Woloszyk et al. | |
| 6,768,452 B2 | 7/2004 | Gilkes | |
| 6,807,485 B1 | 10/2004 | Green | |
| 6,834,528 B2 | 12/2004 | Kappi et al. | |
| 6,964,107 B1 | 11/2005 | Ahola | |
| 6,988,049 B1 | 1/2006 | Wirtz et al. | |
| 7,196,660 B2 | 3/2007 | Abraham | |
| 7,210,236 B2 | 5/2007 | Sato et al | |
| 7,248,983 B2 | 7/2007 | Fillatreau et al. | |
| 7,275,008 B2 | 9/2007 | Plyvanainen | |
| 7,324,906 B2 | 1/2008 | Sato et al. | |
| 7,331,115 B2 | 2/2008 | Schierbeek et al. | |
| 7,346,452 B2 | 3/2008 | Ford et al. | |
| 7,388,541 B1 | 6/2008 | Yang | |
| 7,391,366 B2 | 6/2008 | Park et al. | |
| 7,400,974 B2 | 7/2008 | Fuchs et al. | |
| 7,415,354 B2 | 8/2008 | Alexander | |
| 7,451,549 B1 | 11/2008 | Sodhi et al. | |
| 7,458,166 B2 | 12/2008 | Parks et al. | |
| 7,548,200 B2 | 6/2009 | Garin | |
| 7,565,839 B2 | 7/2009 | Stewart et al. | |
| 7,891,103 B2 | 2/2011 | Mayor et al. | |
| 8,061,049 B2 | 11/2011 | Mayor et al. | |
| 8,437,970 B2 | 5/2013 | Mayor et al. | |
| 2003/0135327 A1 | 7/2003 | Levine et al. | |
| 2005/0154532 A1 | 7/2005 | Close et al. | |
| 2005/0174324 A1 | 8/2005 | Liberty et al. | |
| 2005/0223575 A1 | 10/2005 | Fillatreau et al. | |
| 2005/0240347 A1 | 10/2005 | Yang | |
| 2005/0246099 A1 | 11/2005 | Jendbro et al. | |
| 2005/0288805 A1 | 12/2005 | Moore | |
| 2006/0066295 A1 | 3/2006 | Tamura et al. | |
| 2006/0190174 A1 | 8/2006 | Li et al. | |
| 2006/0195254 A1 | 8/2006 | Ladetto et al. | |
| 2006/0212182 A1* | 9/2006 | Shaw | 701/12 |
| 2006/0271295 A1 | 11/2006 | McLaren et al. | |
| 2007/0103461 A1 | 5/2007 | Suzuno et al. | |
| 2007/0156337 A1 | 7/2007 | Yanni | |
| 2008/0066331 A1 | 3/2008 | Brzezinski et al. | |
| 2008/0143595 A1 | 6/2008 | Colley et al. | |
| 2008/0147686 A1 | 6/2008 | Colley et al. | |
| 2008/0201096 A1 | 8/2008 | Wright et al. | |
| 2009/0033807 A1 | 2/2009 | Sheng et al. | |
| 2009/0054075 A1 | 2/2009 | Boejer | |
| 2009/0070058 A1 | 3/2009 | Lin | |
| 2009/0089001 A1 | 4/2009 | Lin | |
| 2009/0164067 A1* | 6/2009 | Whitehead et al. | 701/41 |
| 2009/0171607 A1 | 7/2009 | Chen et al. | |
| 2009/0172599 A1 | 7/2009 | Nezu | |
| 2009/0326851 A1 | 12/2009 | Tanenhaus | |
| 2010/0121599 A1 | 5/2010 | Boeve et al. | |
| 2010/0188276 A1 | 7/2010 | Griffith et al. | |
| 2010/0305853 A1 | 12/2010 | Schulze et al. | |
| 2011/0106474 A1 | 5/2011 | Kulik et al. | |

FOREIGN PATENT DOCUMENTS

| | | |
|---|---|---|
| JP | 2006-058060 | 3/2006 |
| JP | 2009-192495 | 8/2009 |
| JP | 2010-054431 | 3/2010 |
| WO | WO 2005/040991 | 5/2005 |
| WO | WO 2008/122904 | 10/2008 |
| WO | WO 2009/068116 | 6/2009 |

OTHER PUBLICATIONS

Adiprawita et al., "Development of AHRS (Attitude and Heading Reference System) for Autonomous UAV (Unmanned Aerial Vehicle)," *Proc Int'l Conf Electrical Engineering and Informatics*, Institut Teknologi Bandung, Indonesia, Jun. 17-19, 2004, 4 pages.

An Overview of the Earth's Magnetic Field, "The Earth's Magnetic Field—An Overview", [Online] [Retrieved on May 16, 2009]. Retrieved from the Internet: URL: http://www.geomag.bgs.ac.uk/earthmag.html, 10 pages.

Apptism, Compass Go, © 2009 Apptism, [Online] [Retrieved on Jun. 3, 2009]. Retrieved from the Internet: URL: http://www.apptism.com/apps/compass-go, 2 pages.

Apptism, Focalware, © 2009 Apptism, [Online] [Retrieved on Jun. 3, 2009]. Retrieved from the Internet: URL: http://www.apptism.com/apps/focalware, 2 pages.

Apptism, iTopoMaps, © 2009 Apptism, [Online] [Retrieved on Jun. 2, 2009]. Retrieved from the Internet: URL: http://www.apptism.com/apps/itopomaps, 4 pages.

Camps et al., "Numerical Calibration for 3-Axis Accelerometers and Magnetomors," *IEEE*, 2009, pp. 217-231.

Chris M. Goulet, "Magnetic Declination, Frequently Asked Questions", Oct. 2001, Version 4.4, [Online] [Retrieved on May 16, 2009]. Retrieved from the Internet: URL: http://www.geocities.com/magnetic_declination/, 16 pages.

Harper et al., "Process for Improving GPS acquisition assistance data and server-side location determination for cellular networks," *2004 Intl Symp on GNSS/GPS*, Dec. 6-8, 2004, Sydney, Australia, 15 pages.

PNI Sensor Corporation, "Calibration Computations for Practical Compassing using the PNI-11096 Magnetometer ASIC", Aug. 2008, PNI Corporation © 2001, Santa Rosa, CA, 3 pages.

PNI Sensor Corporation, "Multipoint Calibration Primer", (no publication date available), PNI Corporation, Santa Rosa, CA, 10 pages.

Seong Yun Cho et al., "A Calibration Technique for a Two-Axis Magnetic Compass in Telematics Devices", Jun. 2005, ETRI Journal, vol. 27, No. 3, pp. 280-288.

The Earth's magnetic field, EPS 122: Lecture 5—Earth's magnetic field, 11 pages.

Westerberg, "Compass Go," Apple Apps Store, Oct. 10, 2008, 3 pages.

Zhang and Gao, "A Novel Auto-calibration Method of the Vector Magnetometer," *Ninth Intl Conf on Electronic Measurement & Instruments*, ICEMI '2009, pp. 1-145 through 1-150.

\* cited by examiner

MAGNETOMETER CALIBRATION

CROSS-REFERENCE TO RELATED APPLICATION

This application is a divisional of and claims priority to U.S. application Ser. No. 12/899,392, entitled "Magnetometer Calibration," filed on Oct. 6, 2010, the entire contents of which are incorporated herein by reference.

TECHNICAL FIELD

This disclosure relates generally to sensor measurement calibration, and more particularly to calibrating magnetometer readings on a mobile device.

BACKGROUND

Modern mobile devices may include a variety of applications that depend on an accurate estimate of device location, such as a map application or location-based services (LBS) application. An integrated Global Positioning System (GPS) receiver and onboard sensors (e.g., accelerometers, gyroscopes) can be used to determine location and orientation of the device, and even provide a rough estimate of heading. To improve heading accuracy, a magnetometer can be included on the device. Conventional magnetometer calibration procedures may require the user to maneuver the device in a defined pattern to generate data that can be used to calibrate the magnetometer. Such manual calibration procedures are required to be performed each time the magnetometer error exceeds a threshold value. Additionally, the user may have to repeat the calibration procedure if performed incorrectly.

SUMMARY

A real-time calibration system and method for a mobile device having an onboard magnetometer uses an estimator to estimate magnetometer calibration parameters and a magnetic field external to the mobile device (e.g., the earth magnetic field). The calibration parameters can be used to calibrate uncalibrated magnetometer readings output from the onboard magnetometer. The external magnetic field can be modeled as a weighted combination of a past estimate of the external magnetic field and the asymptotic mean of that magnetic field, perturbed by a random noise (e.g., Gaussian random noise). The weight can be adjusted based on a measure of the statistical uncertainty of the estimated calibration parameters and the estimated external magnetic field. The asymptotic mean of the external magnetic field can be modeled as a time average of the estimated external magnetic field.

In some implementations, a differential statistics calculator can be used to determine differences between the calibrated magnetometer readings (i.e., raw magnetometer readings corrected by estimated calibration parameters) and the estimated external magnetic field projected into device coordinates. This enables possible detection as well as resolution of magnetic interference that can adversely affect heading calculations.

In some implementations, a compass heading calculator can use the estimated external magnetic field and a three-dimensional attitude estimate of the device to provide a responsive heading vector. A calibration level can be used with a World Magnetic Model (WMM) to determine compass heading accuracy.

In some implementations, the attitude of the mobile device may not be available or accurate enough to estimate magnetometer calibration parameters. In such situations, an attitude-independent estimator can use an algebraic linearization formulation of a canonical calibration equation to estimate the bias vector based on an assumption that calibrated magnetometer readings lie on the surface of a sphere.

Various implementations of the subject matter described here may provide one or more of the following advantages. In one or more implementations, the usage of the mobile device attitude information enables a more stable and more accurate estimation of magnetometer calibration parameters. More importantly, accurate calibration can be achieved with less user motion (e.g., less data required) resulting in a speed-up of the calibration process. Thus the magnetometer can be calibrated using motion data generated from a user's normal use of the mobile device without explicit user intervention.

Another advantage is provided by using the estimated external magnetic field (projected into the device coordinate frame) to provide smooth, responsive, calibrated magnetometer output that results in a more accurate and lag-free heading vector for navigation applications running on the mobile device. Without the estimated external magnetic field, calibrated magnetometer readings are obtained from raw (uncalibrated) readings corrected by the estimated calibration parameters. Since the raw readings are usually noisy, the resulting magnetometer heading vectors have to be smoothed by a low-pass filter which introduces noticeable lag.

The details of one or more implementations of magnetometer calibration are set forth in the accompanying drawings and the description below. Other features, aspects, and advantages will become apparent from the description, the drawings, and the claims.

BRIEF DESCRIPTION OF THE DRAWINGS

Like reference symbols in the various drawings indicate like elements.

DETAILED DESCRIPTION

Overview of Compass Application

Figure 1:
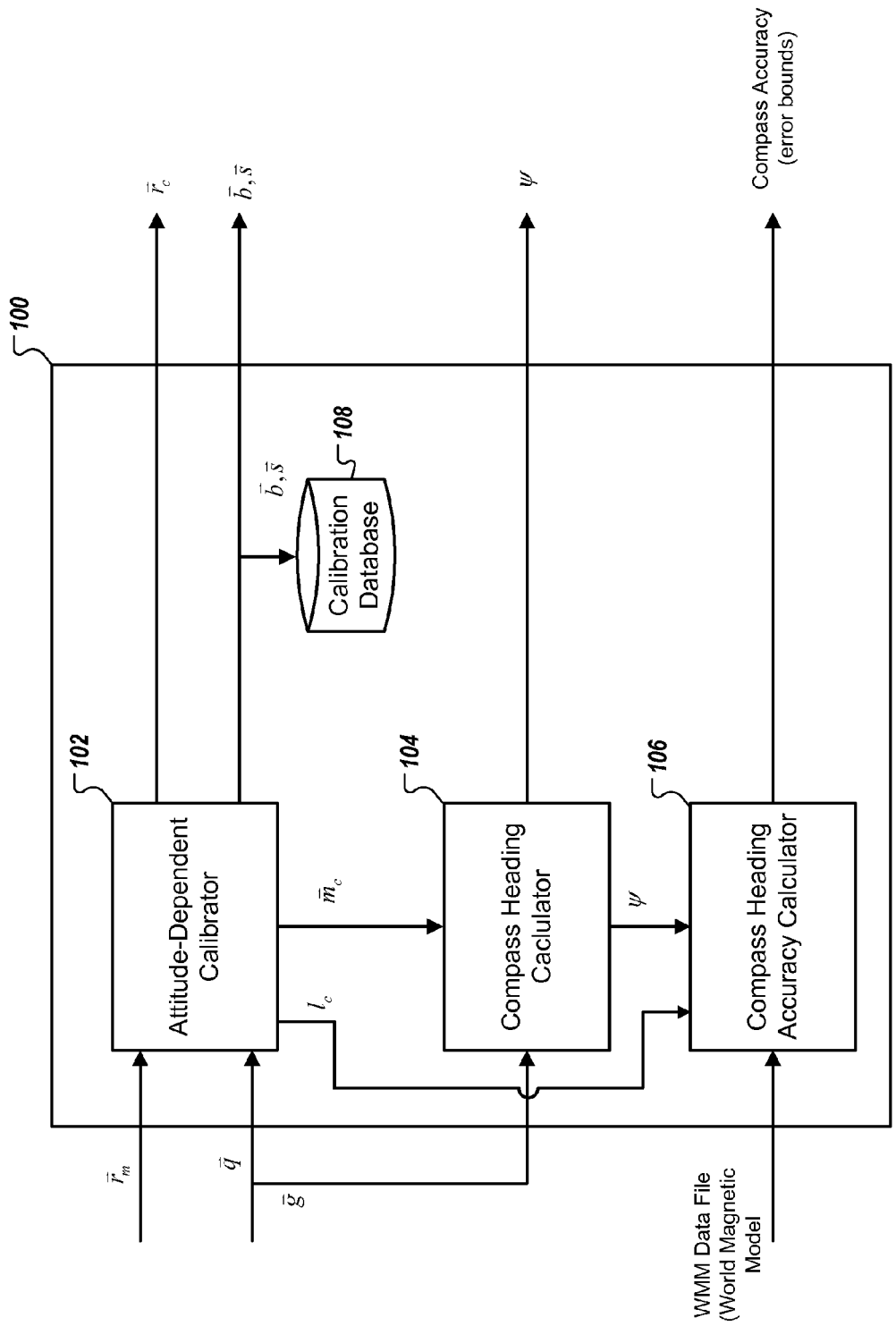
FIG. 1 is a block diagram of an exemplary compass application including an attitude-dependent calibrator.

FIG. 1 is a block diagram of an exemplary compass application 100 including an attitude-dependent calibrator. In some implementations, compass application 100 can include attitude-dependent calculator 102, compass heading calculator 104, compass heading accuracy calculator 106 and calibration database 108. Compass application 100 can be a software program running on a mobile device having a magnetometer, including but not limited to: a smart phone, vehicle navigation system, e-mail device, game device, laptop computer, electronic tablet, media player or any other device that includes a magnetometer. The mobile device can include one or more onboard sensors for determining the attitude (e.g., a gyro sensor) and acceleration (e.g., an accelerometer) of the mobile device.

The mobile device can include a display surface for presenting a user interface for facilitating user input to compass application 100. The display can be a touch sensitive surface capable of responding to multi-touch input with one or more fingers or a stylus. One or more user interface display navigation aids, such as a compass and or map can be presented on the display. In some implementations, a heading is generated and presented on the display as text or graphical object (e.g., a virtual compass with a needle) or as audio output if the mobile device includes an acoustic speaker or headphone jack.

In some implementations, raw or uncalibrated magnetometer readings are input to attitude-dependent calibrator 102. The readings can be read from a magnetometer onboard the mobile device. A magnetometer is an instrument that can sense the strength and direction of the magnetic field in its vicinity. Magnetometers are useful for applications that require dead reckoning or headings, such as navigation applications for vehicles, aircraft, watercraft and mobile devices (e.g., smart phones). Electronic magnetometers are commercially available as integrated circuit chips.

Using the magnetometer for attitude and navigation aiding requires that any magnetic fields that are not caused by the Earth be accounted for. A calibration process can be used to remove magnetic forces caused by magnetic objects on the sensing device. For most magnetometers, the bias error calibration on each of the three magnetometer axes are of main interest. For more accurate calibration, the scale factor error for each axis can also be estimated. The bias errors can be specified in milliGauss (mG) and the scale factor errors can be fractions of one. A magnetic field correction can be performed by attitude-dependent calibrator 102 for each axis using the calibration parameters, as described in reference to FIG. 2. The calibration parameters can be stored in calibration database 108 for use in other processes.

In some implementations, attitude-dependent calibrator 102 also receives device motion data as input. Device motion data can include attitude quaternion $\vec{q}$, which provides the attitude/orientation of the mobile device in a global reference coordinate frame and a gravitational acceleration vector $\vec{g}$ in a device coordinate frame. The attitude quaternion $\vec{q}$ can be derived from an angular rate sensor, such as a gyroscope sensor (e.g., a MEMS gyro sensor). The gyroscope sensor can sense angular rates about two or three-axes of rotation (e.g., roll, pitch, yaw). In some implementations, the raw angular rate data is integrated into angular displacements and transformed into the attitude quaternion $\vec{q}$. In some implementations, the angular rate data can be read in a three-dimensional, Cartesian sensor coordinate system and transformed to device coordinates using an appropriate coordinate transformation matrix $T_{sensor}^{device}$ or quaternion.

An output of attitude-dependent calibrator 102 is the calibrated magnetometer reading vector $\vec{r}_c$ and an estimated external magnetic field vector $\vec{m}_c$ in device coordinates. The estimated external magnetic field vector $\vec{m}_c$ and gravitational acceleration vector $\vec{g}$ can be input into compass heading calculator 104. Compass heading calculator 104 can calculate a smooth heading $\psi$ of the mobile device from $\vec{m}_c$ and $\vec{g}$ using equations [1]-[5] as follows:

$$\theta = -\sin^{-1}\left(\frac{g_x}{|\vec{g}|}\right), \quad [1]$$

$$\phi = \sin^{-1}\left(\frac{g_y}{|\vec{g}|\cos\theta}\right), \quad [2]$$

$$X_h = m_{cx}\cos(\theta) + m_{cy}\sin(\phi)*\sin(\theta) - m_{cz}\cos(\phi)*\sin(\theta) \quad [3]$$

$$Y_h = m_{cx}\cos(\phi) + m_{cy}\sin(\phi) \quad [4]$$

$$\psi = \tan^{-1}\left(\frac{Y_h}{X_h}\right). \quad [5]$$

The smooth and "lag-free" heading $\psi$ is a result of using the estimated external magnetic field vector $\vec{m}_c$ rather than a low-pass filtered calibrated magnetometer reading vector $\vec{r}_c$. Some magnetometer calibration systems apply a low pass filter to remove high frequency noise from $\vec{r}_c$. Such noise can cause jitter in a compass needle or indicator. A low pass filter can be applied to remove the jitter. The low pass filter, however, can cause a noticeable "lag" in a compass reading update. Using the estimated external magnetic field vector $\vec{m}_c$, rather than a low pass filtered calibrated magnetometer reading vector $\vec{r}_c$ removes the undesirable "lag."

In some implementations, a calibration level $l_c$ is output from attitude-dependent calibrator 102 (or 314 of FIG. 3) and input into compass heading accuracy calculator 106, where it can be used with the WMM and the heading $\psi$ output from compass heading calculator 104 to compute a compass accuracy that is suitable for display to a user of compass application 100. Compass heading accuracy can be calculated by comparing the estimated inclination angle to that of the Earth field stored in the WMM, modulated by calibration level $l_c$.

Exemplary Attitude-Dependent Compass Calibration

Figure 2:
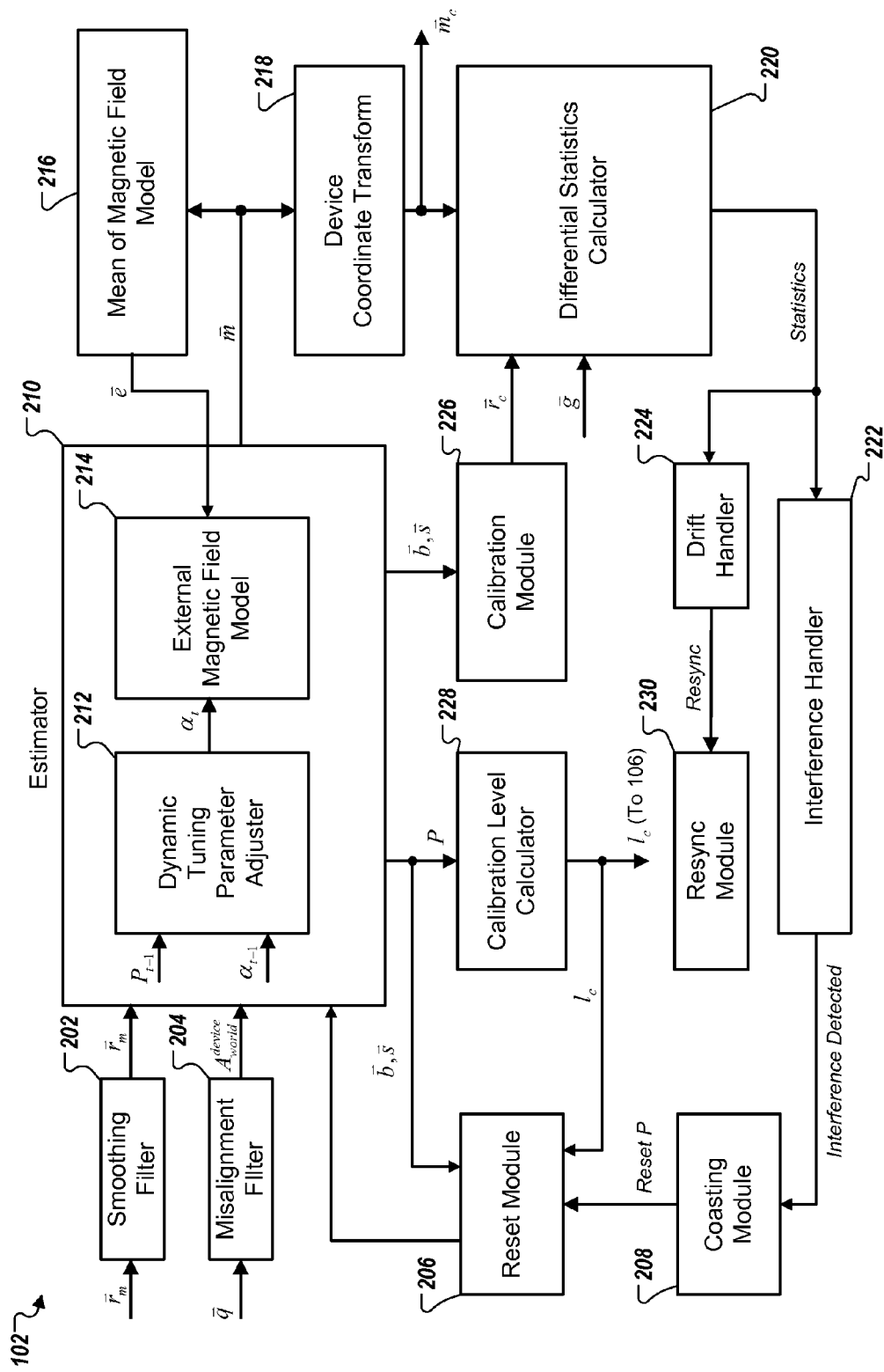
FIG. 2 is a block diagram of an exemplary attitude-dependent calculator of FIG. 1

FIG. 2 is a block diagram of the exemplary attitude-dependent calculator 102 of FIG. 1. In some implementations, attitude-dependent calculator 102 can include smoothing filter 202, misalignment filter 204, reset module 206, coasting module 208, estimator 210, mean external magnetic field model 216, coordinate transform 218, differential statistics calculator 220, interference handler 222, drift handler 224, calibration module 226 and calibration level calculator 228.

In some implementations, an optional smoothing filter 202 (e.g., a low pass filter) can be applied to a small buffer of uncalibrated magnetometer readings for less noisy raw input. Misalignment filter 204 can be applied to the attitude quaternion $\vec{q}$ to filter out attitude data that are misaligned with the raw magnetometer reading $\vec{r}_m$ caused by differing sampling rates of the two. The output of misalignment filter 204 can be an attitude matrix A (e.g., direction cosine matrix), which can be used to transform vector data from global reference coordinates to device coordinates.

In some implementations, the uncalibrated magnetometer readings $\vec{r}_m$ and the attitude matrix A are input into estimator 210. Attitude matrix can be a world to device coordinate transformation matrix $A_{world}^{device}$.

Estimator 210 can be configured to provide estimates of bias and scale factor error vectors $\vec{b}$ and $\vec{s}$, and an estimate of the external magnetic field vector $\vec{m}$. In some implementations, estimator 210 can be a Kalman Filter (KF) formulation that estimates a state vector $\vec{x}$ given by $$\vec{x} = [b_x, b_y, b_z, s_x, s_y, s_z, m_x, m_y, m_z]. \quad [6]$$

In some implementations, an estimate of $\vec{m}$ at time t can be calculated as a weighted combination of a past estimate of $\vec{m}_{t-1}$ at time t-1 and an estimate of the asymptotic mean of $\vec{m}$, denoted as vector $\vec{e}_{t-1}$, and a random noise variable $w_{t-1}$ (e.g., Gaussian random noise), which can be given by the formula $$\vec{m}_t = \alpha m_{t-1} + (1-\alpha)\vec{e}_{t-1} + \sqrt{1-\alpha^2} w_{t-1}, \quad [7]$$

where $\alpha$ is a dynamically adjusted tuning parameter valued between [0 1], $\vec{e}_{t-1}$ is the asymptotic mean of $\vec{m}$, given by a mean magnetic field model 216, $w_{t-1}$ is a random noise variable (e.g., Gaussian random noise) with zero mean and a standard deviation, denoted as $\sigma$, where in some implementations $w_{t-1} \sim N(0, \sigma_{GM})$. The asymptotic mean of the external magnetic field, $\vec{e}_{t-1}$, can be modeled mathematically as $$\vec{e} = \frac{1}{N}\sum_{i=1}^{N}\vec{m}_i, \quad [8]$$

where N is the total number of past estimates of $\vec{m}$ and i is the ith estimate of $\vec{m}$.

In some implementations, $\alpha$ is dynamically adjusted based on the sum of the elements on the main diagonal or trace of the error covariance, tr(P). The trace of the error covariance matrix indicates the convergence properties of the estimator 210. The value of the trace tr(P) decreases as the estimation process converges. The tuning parameter $\alpha$ can be dynamically adjusted to provide greater fidelity of $\vec{m}$ in the beginning of the estimation process (e.g., relies more on contributions of $\vec{m}_{t-1}$) and then stabilizes towards the end of the estimation process when good convergence properties are indicated by the near zero trace of the error covariance tr(P). For example, $\alpha$ may be initially set to 1.0, and then adjusted during the estimation process to a number less than 1.0 (e.g., 0.4) as estimator 210 converges, resulting in the mean external magnetic vector $\vec{e}$ having an increased contribution to the estimate of $\vec{m}_t$. Other methods can also be used to determine if the error covariance P has converged.

The state vector $\vec{x}$ and an error covariance P can be updated using well-known Kalman Filter formulations, which typically include a time update phase and a measurement update phase as follows:

A. Time Update
1. Propagate state $$\vec{x}_k = \Phi \vec{x}_{k-1} + B\vec{u}_{k-1} \quad [9]$$

2. Propagate error covariance $$P_k^- = \Phi P_{k-1}\Phi^T + Q \quad [10]$$

B. Measurement Update
1. Compute Kalman gain $$K_k = P_k^- H^T (H P_k^- H^T + R)^{-1} \quad [11]$$

2. Update estimate with measurement and Kalman gain $$\vec{x}_k = \vec{x}_k^- + K_k(\vec{z}_k - H\vec{x}_k^-) \quad [12]$$

3. Update error covariance with Kalman gain $$P_k = (I - K_k H) P_k^-. \quad [13]$$

In some implementations the state transition matrix $\Phi$, initial error covariance matrix $P_o$, process noise matrix Q, measurement matrix H, measurement noise matrix R, and state vector input $B\vec{u}_{k-1}$ are given by $$\Phi = \begin{bmatrix} I_{3\times3} & O_{3\times3} & O_{3\times3} \\ O_{3\times3} & I_{3\times3} & O_{3\times3} \\ O_{3\times3} & O_{3\times3} & \alpha I_{3\times3} \end{bmatrix}, \quad [14]$$

$$P_o = \begin{bmatrix} \sigma_b^2 I_{3\times3} & O_{3\times3} & O_{3\times3} \\ O_{3\times3} & \sigma_s^2 I_{3\times3} & O_{3\times3} \\ O_{3\times3} & O_{3\times3} & \sigma_m^2 I_{3\times3} \end{bmatrix}, \quad [15]$$

$$Q = \begin{bmatrix} O_{3\times3} & O_{3\times3} & O_{3\times3} \\ O_{3\times3} & O_{3\times3} & O_{3\times3} \\ O_{3\times3} & O_{3\times3} & \sigma_{GM}^2(1-\alpha^2)I_{3\times3} \end{bmatrix}, \quad [16]$$

$$H = [I_{3\times3} \quad -\bar{r}_m I_{3\times3} \quad A], \quad [17]$$

$$R = \sigma_R^2 I_{3\times3}, \quad [18]$$

$$\bar{x}_k = \Phi \bar{x}_{k-1} + \begin{bmatrix} O_{3\times1} \\ O_{3\times1} \\ (1-\alpha)\bar{e}_{k-1} \end{bmatrix}. \quad [19]$$

The output of estimator 210 includes estimates of bias and scale factor error vectors $\vec{b}$ and $\vec{s}$, and an estimate of the external magnetic field vector $\vec{m}$.

As shown in equation [7], $\vec{m}_{t-1}$ is used to update the model of the external magnetic vector $\vec{m}_t$ at time t. In addition, $\vec{m}$ (which is in a global reference coordinates defined by the attitude matrix A) is transformed to an external magnetic field vector in device coordinates $\vec{m}_c$ using device coordinate transform 218 (e.g., attitude matrix $A_{world}^{device}$) as follows:

$$\vec{m}_c = A_{world}^{device} \vec{m}. \quad [20]$$

Calibration module 226 receives estimated vectors $\vec{b}$ and $\vec{s}$ from estimator 210 and calculates $\vec{r}_c$ from uncalibrated magnetometer readings $\vec{r}_m$ using the formula $$\vec{r}_c = (I_{3\times3} + \vec{s} I_{3\times3})^* \vec{r}_m - \vec{b}, \quad [21]$$

where $I_{3\times3}$ is a 3×3 identity matrix.

The estimated external magnetic field vector $\vec{m}_c$ can be used by other functions of compass application 100 or by other applications. For example, $\vec{m}_c$ and $\vec{r}_c$ can be used by differential statistics calculator 220 to calculate differential statistics based on a difference between $\vec{m}_c$ and $\vec{r}_c$. For example, the mean and variance of the magnitude difference, dMag, as well as the angle difference, dAngle, between $\vec{m}_c$ and $\vec{r}_c$ over a sliding window of time can provide a measure of deviation between $\vec{m}_c$ and $\vec{r}_c$, which if large can indicate the presence of magnetic interference, typically from a magnetic object in the vicinity of the mobile device.

In some implementations, attitude-dependent calibrator 102 includes drift handler 224 for correcting the possible effects of accumulated yaw error in the attitude A (e.g., caused by gyro scale factor error) on the output of calibrator 102. Drift handler 224 can receive statistics on dMag and dAngle from differential statistics calculator 220 and use them to determine whether there is a yaw drift. For example, if dAngle is small and varies primarily around gravity $\vec{g}$ (e.g., indicating yaw error), and dMag is within a normal threshold, drift handler 224 sends a resync signal to resync module 230. In response to the resync signal, resync module 230 can correct $\vec{m}_c$ based on $\vec{r}_c$.

In some implementations, calibration level calculator 228 calculates a calibration level $l_c$ based on the convergence properties on the bias vector estimates $\vec{b}$. More specifically, a convergence measure is calculated based on the diagonal elements corresponding to the bias states in the error covariance matrix P and the standard deviation of the last n estimated bias values, where n depends on the rate at which the calibrator is receiving magnetometer samples. For example, a set of discrete calibration levels can be defined based on calculating the portion of tr(P) corresponding to the bias states and comparing the result to the threshold values defined for each calibration level $l_c$. In addition, a standard deviation of the n bias values can also be calculated to determine if the bias values are stable (e.g., the standard deviation is small). The calibration level $l_c$ can be used by compass heading calculator 106 to compute compass accuracy (e.g., compute error bounds).

In some implementations, $l_c$ can be an integer representing a level of calibration accuracy, where the larger the integer the greater the accuracy of the calibration. For example, $l_c=2$ means a less accurate calibration than $l_c=5$. In some implementations, $l_c$ can be used to reset the error covariance P. In some implementations, when it is necessary to reset estimator 210 from prior knowledge of a set of roughly correct calibration bias, scale factor vectors and associated calibration level $l_c$, $l_c$ can be used to initialize the error covariance matrix P as a fraction of the initial $P_o$ when no prior knowledge is available.

The calibration level $l_c$ is also input into reset module 206, where it is used with the corresponding set of calibration vectors $\vec{b}$ and $\vec{s}$ to trigger a reset of (state vector $\vec{x}$ and error covariance P) of estimator 210. This ensures that estimates of vectors $\vec{b}$, $\vec{s}$ and $\vec{m}$ stay adaptive to changing environments without the need of explicit user intervention, such as a manual recalibration procedure performed by the user.

In some implementations, interference handler 222 receives deviation statistics from differential statistics calculator 220 and uses the statistics to determine if a magnetic interference event has occurred. For a mobile device that includes components like a vibrator and an acoustic speaker, the operation of these components can cause magnetic interference noise that can be picked up by the magnetometer sensor. Environmental magnetic interference is also commonplace in any metropolitan setting. To minimize the side effects caused by such interferences on the output of estimator 210, interference handler 222 can be configured to detect onset (as well as disappearance) of magnetic interference based on thresholding the output of the differential statistics calculator 220. For example, in response to the delta magnitude dMag exceeding an interference threshold, an "interference detected" signal can be sent to coasting module 208. During coast mode, a recently stored $\vec{m}$ when no interference was detected can be used instead of the current estimate of $\vec{m}$ to compute the output $\vec{m}_c$ and heading $\psi$. When the magnetic interference falls below the interference threshold, coasting stops. When a detected interference lasts beyond a time threshold, a reset signal is sent to reset module 206, causing it to reset estimator 210 in order to re-estimate the calibration vectors $\vec{b}$ and $\vec{s}$. Based on the last calibration level $l_c$, reset module 206 can reset the error covariance P with new values (e.g., larger values) that will cause estimator 210 to converge again on new magnetometer readings $\vec{r}_m$. The state vector $\vec{x}$ can be reset with the last estimates of $\vec{b}$ and $\vec{s}$. The new estimates can be used if they are stable and the interference is still present after a prolonged period of time indicating that the previous calibration estimates are likely inaccurate.

Exemplary Attitude-Independent Compass Calibration

In some implementations, the attitude of the mobile device may not be available or accurate enough to estimate magnetometer calibration parameters. In such situations, an estimator can use an algebraic linearization formulation of a canonical calibration equation to estimate the bias vector based on an assumption that calibrated magnetometer readings lie on the surface of a sphere. The presence of a bias error vector will cause the center of the sphere to be offset from the origin of the magnetometer coordinate frame. The presence of scale factor error will cause the sphere to distort into an ellipsoid. This effect can be modeled by the general equation for an ellipsoid. When bias error and scale factor error are zero, equation [22] below gives the equation of a sphere having its center at the origin of a three-dimensional Cartesian reference coordinate frame:

$$\left(\frac{r_x - b_x}{s_x}\right)^2 + \left(\frac{r_y - b_y}{s_y}\right)^2 + \left(\frac{r_z - b_z}{s_z}\right)^2 = R^2. \qquad [22]$$

A linear estimator (e.g., a linear Kalman Filter) can be used to estimate bias, while avoiding the computational complexity (and likely inaccuracies) that would be introduced due to linear approximation that would be introduced by non-linear estimator models (e.g., an extended Kalman Filter). The algebraic linearization formulation introduces an intermediate unknown variable μ derived from the unknown radius of the sphere R and the unknown bias vector $\vec{b}$ given by $$\mu = R^2 - \|\vec{b}\|^2. \qquad [23]$$

The state vector $\vec{x}$ of the estimator is thus given by $$\vec{x} = [\mu, b_x, b_y, b_z], \qquad [24]$$

where μ is modeled by $$\mu_t = \beta \mu_{t-1} + (1-\beta)\rho + \sqrt{(1-\beta^2)} \upsilon_{t-1}, \qquad [25]$$

where β is a weighting factor valued in [0 1], ρ is an estimate of the asymptotic mean of μ and υ is a random variable (e.g., Gaussian random variable) with a certain given variance and zero mean. ρ can be modeled separately as a time average of all past estimates of μ.

The state vector and error covariance matrix can be updated using the Kalman Filter formulation of equations [9]-[19].

Exemplary Magnetometer Calibration Processes

Figure 3A:
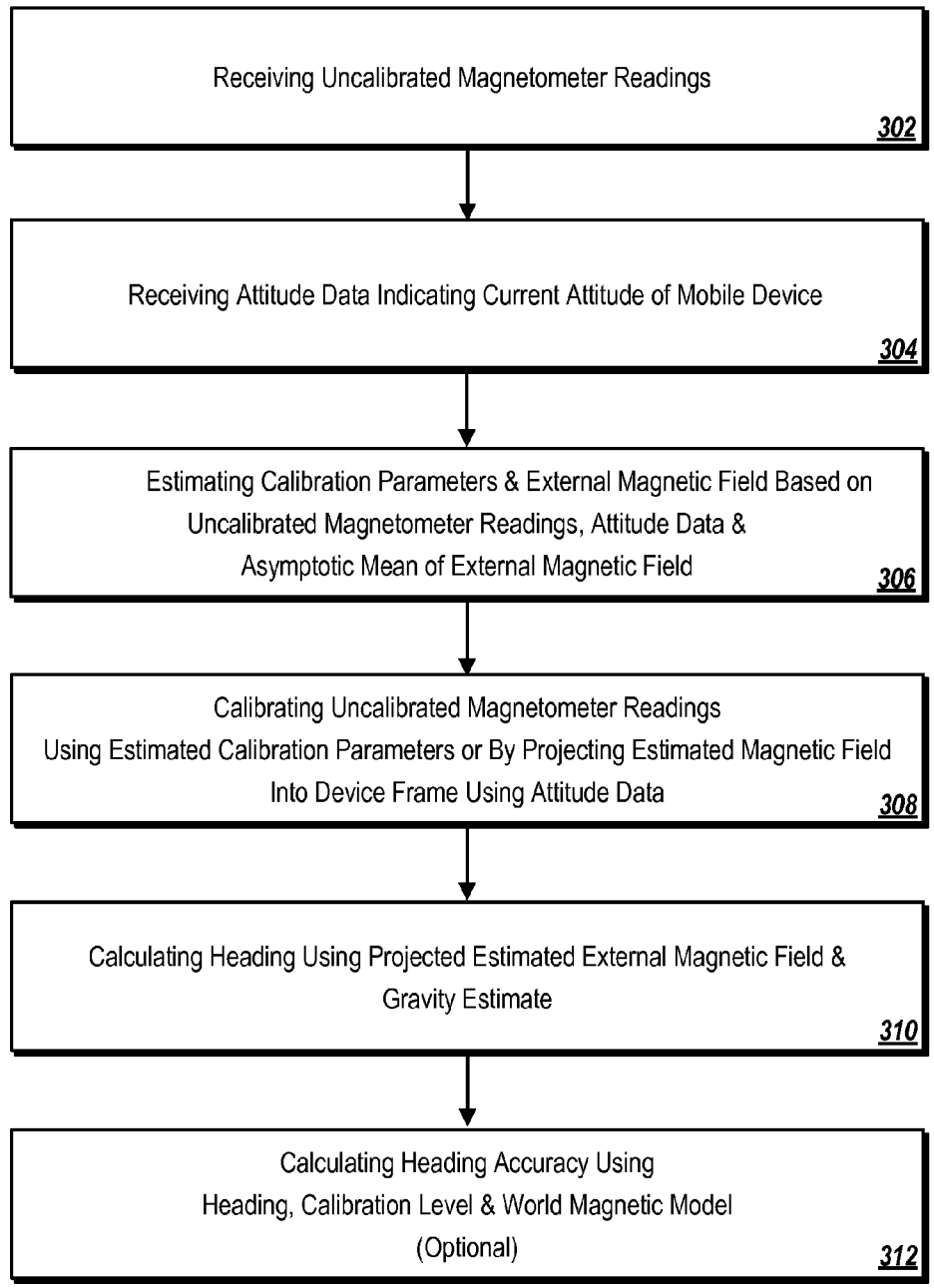
FIG. 3A is a flow diagram of an exemplary process for calibrating magnetometer readings and providing a smooth, lag-free heading vector using attitude-dependent calibration.

FIG. 3A is a flow diagram of an exemplary process 300 for calibrating magnetometer readings and providing a smooth, lag-free heading vector. Process 300 will be described in reference to attitude-dependent calibrator 102 of FIG. 2

In some implementations, process 300 can begin when attitude-dependent calibrator 102 operating on a mobile device receives uncalibrated magnetometer readings (302) and attitude data indicating a current attitude of the mobile device (304). The attitude data can be in the form of a direction cosine matrix or a quaternion. The attitude can be based on gyro sensor readings from an onboard gyro sensor and accelerometer readings from an onboard accelerometer.

The magnetometer readings and attitude data are input to an estimator, which estimates magnetometer calibration parameters and an external magnetic field vector based on the uncalibrated magnetometer readings, attitude data and a model of the asymptotic mean of the external magnetic field (306). In some implementations, the calibration parameters can include bias and scale factor errors or just bias errors. In some implementations, the estimator can be implemented using a Kalman Filter formulation. The external magnetic field vector can be modeled as a weighted combination of the estimate of the external magnetic field at the previous time step and a model of the asymptotic mean of the field, perturbed by zero mean noise (e.g., Gaussian noise), using, for example, equation [7]. In some implementations, the asymptotic mean of the magnetic field is modeled as a time average of past estimates of the external magnetic field, using, for example, equation [8]. The weighting can be a dynamically adjustable tuning parameter, which can be adjusted based on convergence properties of the estimator. For example, if the estimator is a Kalman Filter, then the trace of the main diagonal of the error covariance matrix can be used to determine the amount of adjustment during the estimation process. The smaller the trace the smaller the value of the tuning parameter, as shown in equation [7].

The estimated calibration parameters are used to calibrate the uncalibrated magnetometer readings (308), using, for example, equation [21].

Heading can be calculated using the estimated external magnetic field and gravity estimate, projected into device coordinates, using, for example, equations [1]-[5]. Optionally, heading accuracy can be calculated using the calculated heading, a calibration level and a WMM (312).

Figure 3B:
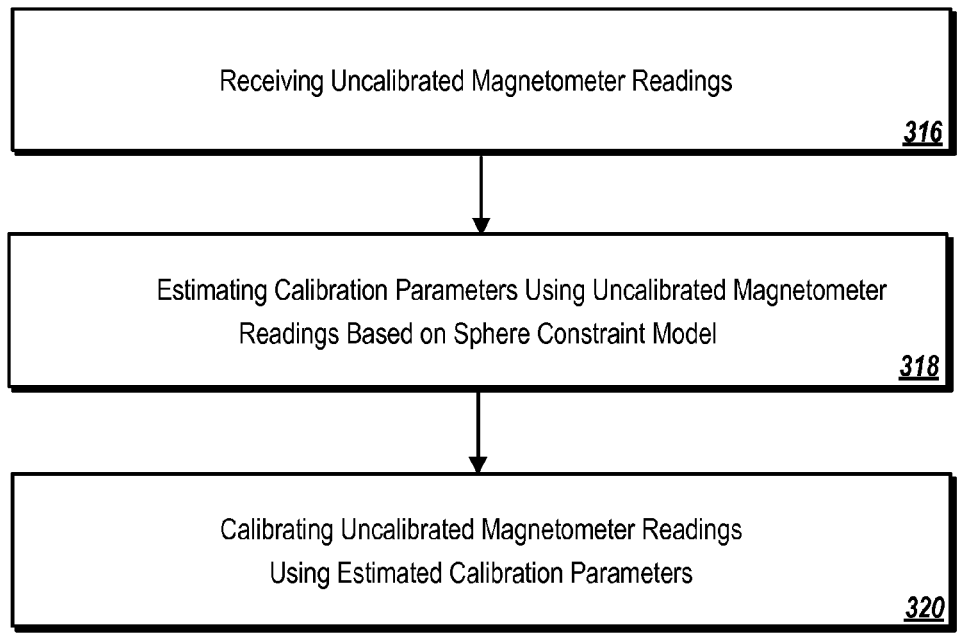
FIG. 3B is a flow diagram of an exemplary process for calibrating magnetometer readings using attitude-independent calibration.

FIG. 3B is a flow diagram of an exemplary process 314 for calibrating magnetometer readings using attitude-independent calibration. In some implementations, process 314 can begin when an attitude-independent calibrator operating on a mobile device receives uncalibrated magnetometer readings (316). The uncalibrated magnetometer readings are input to a linear estimator, which estimates magnetometer calibration parameters using the uncalibrated magnetometer readings based on a sphere constraint model (318). In some implementations, the bias calibration parameters can be estimated using a linear estimator based on an algebraic linearization of the sphere constraint model using an intermediate variable. In some implementations, the estimator can be implemented using a linear Kalman Filter formulation, whose state vector includes both the bias vector and the intermediate variable. The time dynamics of the intermediate variable can be modeled by a Gauss-Markov process as show in equation [25]. The calibration parameters are used to calibrate the uncalibrated magnetometer readings (320), by subtracting the estimated bias from the uncalibrated raw magnetometer readings.

Exemplary Mobile Device Architecture

Figure 4:
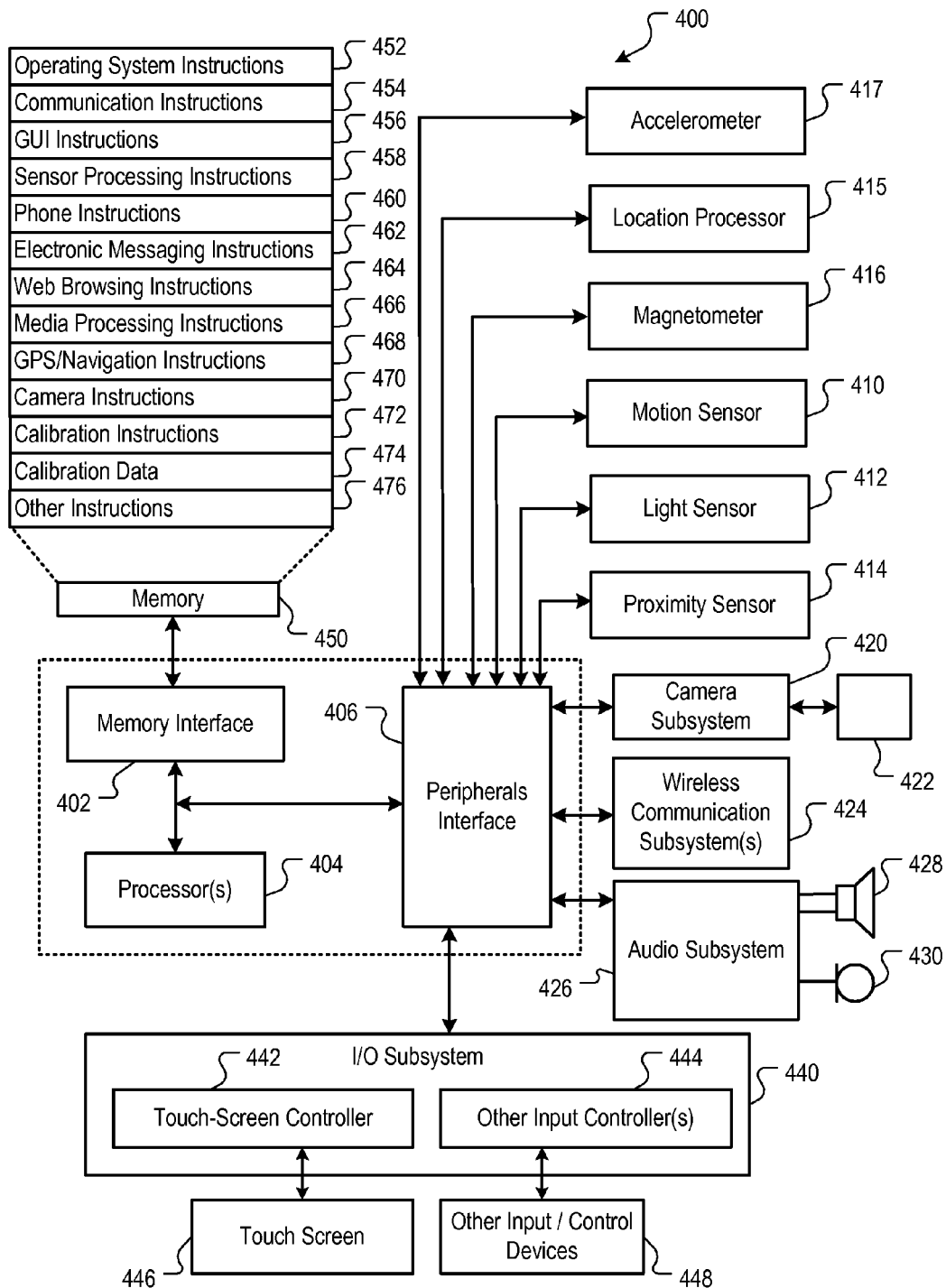
FIG. 4 is a block diagram of exemplary hardware architecture for a device implementing the features and processes described in reference to FIGS. 1-3.

FIG. 4 is a block diagram of exemplary hardware architecture for a device implementing the features and processes described in reference to FIGS. 1-3. The device can include memory interface 402, one or more data processors, image processors and/or processors 404, and peripherals interface 406. Memory interface 402, one or more processors 404 and/or peripherals interface 406 can be separate components or can be integrated in one or more integrated circuits. The various components in the device, for example, can be coupled by one or more communication buses or signal lines.

Sensors, devices, and subsystems can be coupled to peripherals interface 406 to facilitate multiple functionalities. For example, motion sensor 410, light sensor 412, and proximity sensor 414 can be coupled to peripherals interface 406 to facilitate orientation, lighting, and proximity functions of the mobile device. Location processor 415 (e.g., GPS receiver) can be connected to peripherals interface 406 to provide geopositioning. Electronic magnetometer 416 (e.g., an integrated circuit chip) can also be connected to peripherals interface 406 to provide data that can be used to determine the direction of magnetic North. Thus, electronic magnetometer 416 can be used as an electronic compass. Accelerometer 417 can also be connected to peripherals interface 406 to provide data that can be used to determine change of speed and direction of movement of the mobile device.

Camera subsystem 420 and an optical sensor 422, e.g., a charged coupled device (CCD) or a complementary metal-oxide semiconductor (CMOS) optical sensor, can be utilized to facilitate camera functions, such as recording photographs and video clips.

Communication functions can be facilitated through one or more wireless communication subsystems 424, which can include radio frequency receivers and transmitters and/or optical (e.g., infrared) receivers and transmitters. The specific design and implementation of the communication subsystem 424 can depend on the communication network(s) over which a mobile device is intended to operate. For example, a mobile device can include communication subsystems 424 designed to operate over a GSM network, a GPRS network, an EDGE network, a WiFi or WiMax network, and a Bluetooth network. In particular, the wireless communication subsystems 424 can include hosting protocols such that the mobile device can be configured as a base station for other wireless devices.

Audio subsystem 426 can be coupled to a speaker 428 and a microphone 430 to facilitate voice-enabled functions, such as voice recognition, voice replication, digital recording, and telephony functions.

I/O subsystem 440 can include touch screen controller 442 and/or other input controller(s) 444. Touch-screen controller 442 can be coupled to a touch screen or surface 446. Touch screen or surface 446 and touch screen controller 442 can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with touch screen 446.

Other input controller(s) 444 can be coupled to other input/control devices 448, such as one or more buttons, rocker switches, thumb-wheel, infrared port, USB port, and/or a pointer device such as a mouse or stylus. The one or more buttons (not shown) can include an up/down button for volume control of speaker 428 and/or microphone 430.

In one implementation, a pressing of the button for a first duration may disengage a lock of the touch screen 446; and a pressing of the button for a second duration that is longer than the first duration may turn power to the device on or off. The user may be able to customize a functionality of one or more of the buttons. The touch screen 446 can, for example, also be used to implement virtual or soft buttons and/or a virtual keyboard.

In some implementations, the device can present recorded audio and/or video files, such as MP3, AAC, and MPEG files. In some implementations, the device can include the functionality of an MP3 player. The device may include a pin connector that is compatible with accessories.

Memory interface 402 can be coupled to memory 450. Memory 450 can include high-speed random access memory and/or non-volatile memory, such as one or more magnetic disk storage devices, one or more optical storage devices, and/or flash memory (e.g., NAND, NOR). Memory 450 can store operating system 452, such as Darwin, RTXC, LINUX, UNIX, OS X, WINDOWS, or an embedded operating system such as VxWorks. Operating system 452 may include instructions for handling basic system services and for performing hardware dependent tasks. In some implementations, operating system 452 can include a kernel (e.g., UNIX kernel).

Memory 450 may also store communication instructions 454 to facilitate communicating with one or more additional devices, one or more computers and/or one or more servers. Memory 450 may include graphical user interface instructions 456 to facilitate graphic user interface processing; sensor processing instructions 458 to facilitate sensor-related processing and functions; phone instructions 460 to facilitate phone-related processes and functions; electronic messaging instructions 462 to facilitate electronic-messaging related processes and functions, such as SMS and MMS; web browsing instructions 464 to facilitate web browsing-related processes and functions; media processing instructions 466 to facilitate media processing-related processes and functions; GPS/Navigation instructions 468 to facilitate GPS and navigation-related processes and instructions; and camera instructions 470 to facilitate camera-related processes and functions. The memory 450 may also store other software instructions (not shown), such as security instructions, web video instructions to facilitate web video-related processes and functions, and/or web shopping instructions to facilitate web shopping-related processes and functions.

Memory 450 can include instructions for magnetometer calibration 472 and associated calibration data 474, as well as other instructions 476 for implementing the feature, user interfaces, and processes described in reference to FIGS. 1-4.

Each of the above identified instructions and applications can correspond to a set of instructions for performing one or more functions described above. These instructions need not be implemented as separate software programs, procedures, or modules. Memory 450 can include additional instructions or fewer instructions. Furthermore, various functions of the mobile device may be implemented in hardware and/or in software, including in one or more signal processing and/or application specific integrated circuits.

Exemplary Operating Environment

Figure 5:
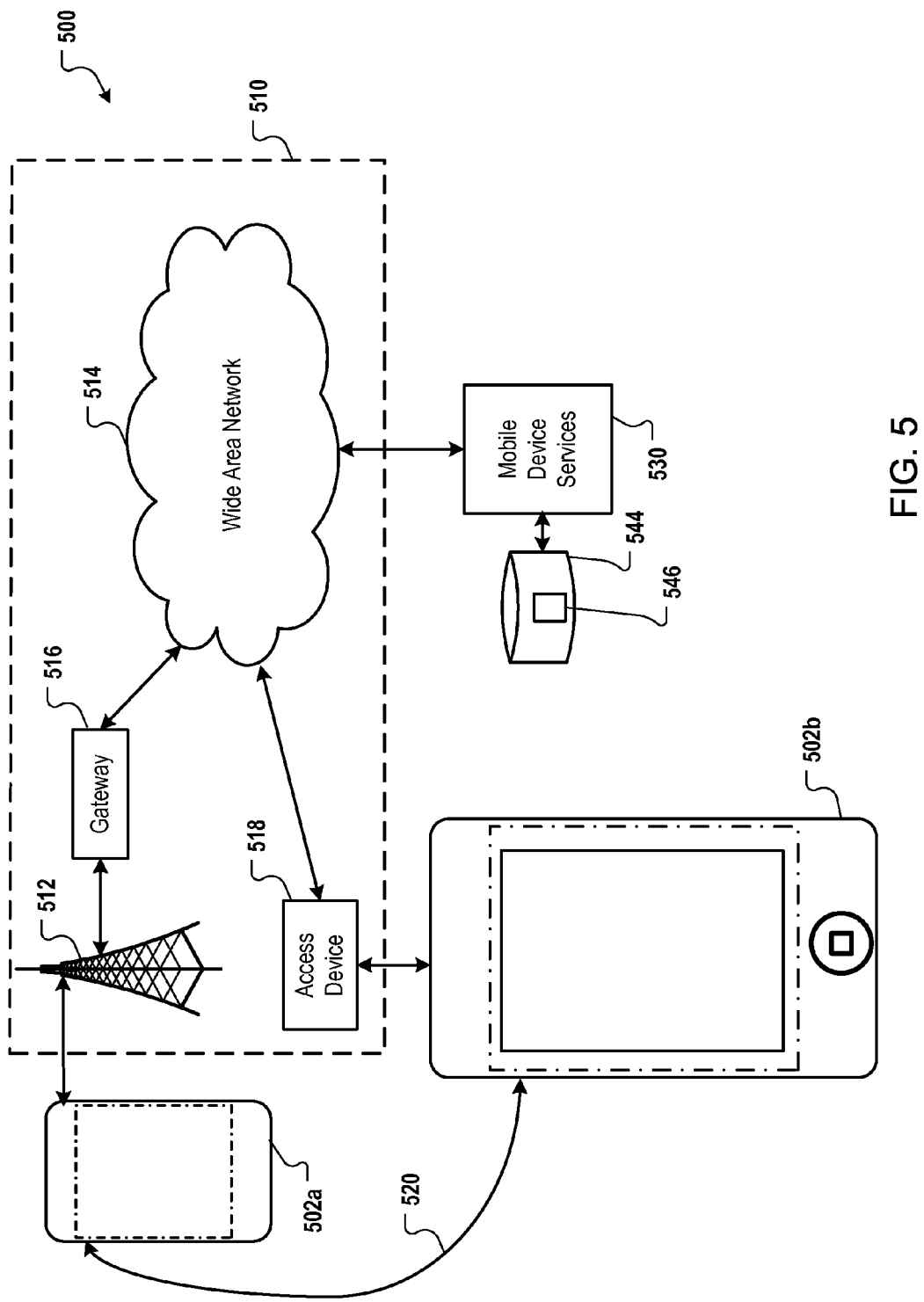
FIG. 5 is a block diagram of exemplary network operating environment for the device of FIG. 4.

FIG. 5 is a block diagram of exemplary network operating environment for the device of FIG. 4. In this example, devices 502a and 502b can, for example, communicate over one or more wired and/or wireless networks 510 in data communication. For example, a wireless network 512, e.g., a cellular network, can communicate with a wide area network (WAN) 514, such as the Internet, by use of a gateway 516. Likewise, an access device 518, such as an 802.11g wireless access device, can provide communication access to the wide area network 514. Although this example illustrates an operating environment for mobile devices, the operating environment can also be applied to a device that is wired to a network (e.g., a desktop computer).

In some implementations, both voice and data communications can be established over wireless network 512 and the access device 518. For example, mobile device 502a can place and receive phone calls (e.g., using voice over Internet Protocol (VoIP) protocols), send and receive e-mail messages (e.g., using Post Office Protocol 3 (POP3)), and retrieve electronic documents and/or streams, such as web pages, photographs, and videos, over wireless network 512, gateway 516, and wide area network 514 (e.g., using Transmission Control Protocol/Internet Protocol (TCP/IP) or User Datagram Protocol (UDP)). Likewise, in some implementations, the mobile device 502b can place and receive phone calls, send and receive e-mail and text messages, and retrieve electronic documents over the access device 518 and the wide area network 514. In some implementations, device 502a or 502b can be physically connected to the access device 518 using one or more cables and the access device 518 can be a personal computer. In this configuration, device 502a or 502b can be referred to as a "tethered" device.

Devices 502a and 502b can also establish communications by other means. For example, wireless device 502a can communicate with other wireless devices, e.g., other devices 502a or 502b, cell phones, etc., over the wireless network 512. Likewise, devices 502a and 502b can establish peer-to-peer communications 520, e.g., a personal area network, by use of one or more communication subsystems, such as the Bluetooth™ communication devices. Other communication protocols and topologies can also be implemented.

Device 502a or 502b can communicate with a variety of network services over the one or more wired and/or wireless networks. In some implementations, network services can include mobile device services 530. Mobile device services 530 can provide a variety of services for device 502a or 502b, including but not limited to calibration services, mail services, text messaging, chat sessions, videoconferencing, Internet services, location based services (e.g., map services), sync services, remote storage 544, downloading services, etc. Remote storage 544 can be used to store calibration data 546, which can be made available to other users.

Device 502a or 502b can also access other data and content over the one or more wired and/or wireless networks. For example, content publishers, such as news sites, Rally Simple Syndication (RSS) feeds, web sites, blogs, social networking sites, developer networks, etc., can be accessed by device 502a or 502b. Such access can be provided by invocation of a web browsing function or application (e.g., a browser) in response to a user touching, for example, a Web object.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. Some elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network. The relationship of client and server arises by virtue of computer programs running on the respective computers and having a client-server relationship to each other.

One or more features or steps of the disclosed embodiments can be implemented using an Application Programming Interface (API). An API can define on or more parameters that are passed between a calling application and other software code (e.g., an operating system, library routine, function) that provides a service, that provides data, or that performs an operation or a computation.

The API can be implemented as one or more calls in program code that send or receive one or more parameters through a parameter list or other structure based on a call convention defined in an API specification document. A parameter can be a constant, a key, a data structure, an object, an object class, a variable, a data type, a pointer, an array, a list, or another call. API calls and parameters can be implemented in any programming language. The programming language can define the vocabulary and calling convention that a programmer will employ to access functions supporting the API.

In some implementations, an API call can report to an application the capabilities of a device running the application, such as input capability, output capability, processing capability, power capability, communications capability, etc.

A number of implementations have been described. Nevertheless, it will be understood that various modifications may be made. For example, elements of one or more implementations may be combined, deleted, modified, or supplemented to form further implementations. Yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A computer-implemented method performed by a mobile device having a magnetometer, comprising:
   receiving uncalibrated magnetometer readings from the magnetometer;
   estimating, by the mobile device, bias calibration parameters based on the uncalibrated magnetometer readings and an algebraic linearization of a sphere constraint model using a bias vector and an intermediate variable;
   calibrating, by the mobile device, the uncalibrated magnetometer readings using the estimated bias calibration parameters;
   generating, by the mobile device, a compass heading from the calibrated magnetometer readings; and
   presenting, by the mobile device, the compass heading.

2. The method of claim 1, where the estimating further comprises
   estimating using a linear Kalman Filter formulation, whose state vector includes both the bias vector and the intermediate variable.

3. The method of claim 2, further comprising:
   modeling time dynamics of the intermediate variable using a Gauss-Markov process.

4. The method of claim 3, further comprising:
   modeling the intermediate variable μ by $$\mu_t = \beta\mu_{t-1} + (1-\beta)\rho + \sqrt{(1-\beta^2)}\upsilon_{t-1},$$

where β is a weighting factor valued in [0 1], ρ is an estimate of the asymptotic mean of μ and υ is a random variable with a certain given variance and zero mean.

5. A magnetometer calibration system, comprising:
   a magnetometer;
   a processor coupled to the magnetometer and configured for executing instructions to perform operations comprising:
   receiving uncalibrated magnetometer readings;
   estimating bias calibration parameters based on the uncalibrated magnetometer readings and an algebraic linearization of a sphere constraint model using a bias vector and an intermediate variable;
   calibrating the uncalibrated magnetometer readings using the estimated bias calibration parameters;
   generating, by the mobile device, a compass heading from the calibrated magnetometer readings; and
   presenting, by the mobile device, the compass heading.

6. The system of claim 5, where a linear Kalman Filter formulation is used to estimate a state vector that includes the bias vector and the intermediate variable.

7. The system of claim 6, where the time dynamics of the intermediate variable is modeled using a Gauss-Markov process.

8. The system of claim 7, where the intermediate variable p is modeled by $$\mu_t = \beta\mu_{t-1} + (1-\beta)\rho + \sqrt{(1-\beta^2)}\upsilon_{t-1},$$

where $\beta$ is a weighting factor valued in [0 1], $\rho$ is an estimate of the asymptotic mean of $\mu$ and $\upsilon$ is a random variable with a certain given variance and zero mean.

\* \* \* \* \*

UNITED STATES PATENT AND TRADEMARK OFFICE
CERTIFICATE OF CORRECTION

PATENT NO. : 9,229,084 B2
APPLICATION NO. : 14/269677
DATED : January 5, 2016
INVENTOR(S) : Xiaoyuan Tu It is certified that error appears in the above-identified patent and that said Letters Patent is hereby corrected as shown below:

Column 14; Line 64 (Claims); In Claim 8, delete "p" and insert -- µ --, therefor.

Signed and Sealed this
Nineteenth Day of April, 2016

Michelle K. Lee
*Director of the United States Patent and Trademark Office*